(12) United States Patent
Qin et al.

(10) Patent No.: US 12,495,651 B2
(45) Date of Patent: Dec. 9, 2025

(54) LED DISPLAY UNIT GROUP AND DISPLAY PANEL

(71) Applicant: FOSHAN NATIONSTAR OPTOELECTRONICS CO., LTD., Foshan (CN)

(72) Inventors: Kuai Qin, Foshan (CN); Shaojia Xie, Foshan (CN); Feng Gu, Foshan (CN); Bin Cai, Foshan (CN); Kailiang Fan, Foshan (CN); Zhuang Peng, Foshan (CN)

(73) Assignee: FOSHAN NATIONSTAR OPTOELECTRONICS CO., LTD., Foshan (CN)

( * ) Notice: Subject to any disclaimer, the term of this patent is extended or adjusted under 35 U.S.C. 154(b) by 601 days.

(21) Appl. No.: 17/910,295

(22) PCT Filed: Mar. 25, 2021

(86) PCT No.: PCT/CN2021/082932
§ 371 (c)(1),
(2) Date: Sep. 8, 2022

(87) PCT Pub. No.: WO2021/197188
PCT Pub. Date: Oct. 7, 2021

(65) Prior Publication Data
US 2023/0155092 A1    May 18, 2023

(30) Foreign Application Priority Data
Mar. 31, 2020    (CN) .......................... 202010247535.4

(51) Int. Cl.
*H10H 20/00*    (2025.01)
*H01L 25/075*    (2006.01)
(Continued)

(52) U.S. Cl.
CPC ....... *H10H 20/857* (2025.01); *H01L 25/0753* (2013.01); *H10H 20/831* (2025.01); *H10H 29/142* (2025.01)

(58) Field of Classification Search
CPC .. H10H 20/857; H10H 29/142; H10H 20/831; H01L 25/075
See application file for complete search history.

(56) References Cited

U.S. PATENT DOCUMENTS

2019/0280163 A1   9/2019  Li et al.
2021/0383744 A1*  12/2021  Harada ..................... G09G 3/32
(Continued)

FOREIGN PATENT DOCUMENTS

CN    102405493 A    4/2012
CN    109411455 A    3/2019
(Continued)

OTHER PUBLICATIONS

CN 109411455 A; published in Mar. 1, 2019 (Year: 2019).*
(Continued)

*Primary Examiner* — Pete T Lee
(74) *Attorney, Agent, or Firm* — CM Law; Stephen J. Weed

(57) ABSTRACT

Provided are a LED display unit group and a display panel. The LED display unit group includes a circuit board and pixel units. The circuit board includes N metal wiring layers stacked in sequence and an insulating plate disposed between adjacent metal wiring layers, and the N metal wiring layers are electrically connected through conductive
(Continued)

vias on the insulating plate. The pixel units are arranged in an array of m rows and n columns and disposed on the circuit board. Each pixel unit includes at least two LED light-emitting chips with different emitted colors, each LED light-emitting chip is fixed on a first metal wiring layer. The first metal wiring layer includes m common A-electrode pads, A-electrode pads, and B-electrode pads. All the A-electrode pads corresponding to each row of pixel units are integrally formed with and electrically connected to one corresponding common A-electrode pad.

18 Claims, 5 Drawing Sheets

(51) Int. Cl.
  *H10H 20/831* (2025.01)
  *H10H 20/857* (2025.01)
  *H10H 29/14* (2025.01)

(56) References Cited

U.S. PATENT DOCUMENTS

2021/0384175 A1* 12/2021 Dupont ............... H10H 20/853
2021/0384377 A1* 12/2021 Imahori ............ G02F 1/133603

FOREIGN PATENT DOCUMENTS

| | | |
|---|---|---|
| CN | 208570653 U | 3/2019 |
| CN | 209015627 U | 6/2019 |
| CN | 111430339 A | 7/2020 |
| CN | 111430340 A | 7/2020 |
| JP | 2006269769 A | 10/2006 |

OTHER PUBLICATIONS

Translated Chinese First Office Action, dated Jun. 17, 2021. pp. 1-5.
International Search Report and Written Opinion, PCT/CN2021/082932, filed Mar. 25, 2021. Mailing date of Search Report Jun. 25, 2021. pp. 1-4.

* cited by examiner

LED DISPLAY UNIT GROUP AND DISPLAY PANEL

CROSS-REFERENCE TO RELATED APPLICATIONS

This is a National Stage Application filed under 35 U. S.C. 371 based on International Patent Application No. PCT/CN2021/082932, filed on Mar. 25, 2021, which claims priority to Chinese Patent Application No. 202010247535.4 filed with the China National Intellectual Property Administration (CNIPA) on Mar. 31, 2020, the disclosures of which are incorporated herein by reference in their entireties.

TECHNICAL FIELD

Embodiments of the present application relate to the field of light-emitting diode (LED) display technologies, for example, an LED display unit group and a display panel.

BACKGROUND

With the development of display technologies, the indoor small-pitch LED display screen has become the main technology expending space in the future. The pixel unit density of the indoor small-pitch LED display screen needs to satisfy increasingly higher requirements, that is, the pixel unit pitch is required to be as small as possible.

As the number of light-emitting units integrated in the small-pitch LED display screen increases, more metal pads, conductive leads and pins need to be configured, causing the subsequent welding to be difficult and the wiring of the printed circuit board (PCB) to be more complicated.

The structure of a traditional LED display unit group cannot achieve the improvement of the integration level of small-pitch LEDs and the improvement of the circuit stability of the LED display unit group at the same time.

SUMMARY

In view of this, embodiments of the present application provide a LED display unit group and a display panel, so as to solve the technical problem in the related art that the improvement of the integration level of small-pitch LEDs and the improvement of the circuit stability of the LED display unit group cannot be achieved at the same time.

An embodiment of the present application provides a LED display unit group. The LED display unit group includes a circuit board and pixel units.

The circuit board includes N metal wiring layers stacked in sequence and an insulating plate disposed between adjacent metal wiring layers among the N metal wiring layers, and the N metal wiring layers are electrically connected through conductive vias on the insulating plate, where $N \geq 2$.

The pixel units are arranged in an array of m rows and n columns and disposed on the circuit board, where each of the pixel units includes at least two LED light-emitting chips with different emitted colors, each of the at least two LED light-emitting chips is fixed on a first metal wiring layer among the N metal wiring layers, $m \geq 2$, and $n \geq 2$.

The first metal wiring layer includes m common A-electrode pads, a plurality of A-electrode pads, and a plurality of B-electrode pads, where the plurality of A-electrode pads are disposed in one-to-one correspondence with A electrodes of LED light-emitting chips, the plurality of B-electrode pads are disposed in one-to-one correspondence with B electrodes of the LED light-emitting chips, and all A-electrode pads corresponding to each row of pixel units are integrally formed with and electrically connected to one of the m common A-electrode pads corresponding to the each row of pixel units.

Each of the m common A-electrode pads includes at least one bend part, and a bending direction of the at least one bend part of one of the m common A-electrode pads corresponding to a first row of pixel units is opposite to a bending direction of the at least one bend part of one of the m common A-electrode pads corresponding to an m-th row of pixel units.

In an embodiment, an N-th metal wiring layer among the N metal wiring layers includes m common A-electrode pins and 3n common B-electrode pins, where one of the m common A-electrode pins is electrically connected to one of the m common A-electrode pads corresponding to A electrodes of all LED light-emitting chips in one row of pixel units, and one of the 3n common B-electrode pins is electrically connected to a plurality of B-electrode pads corresponding to B electrodes of all LED light-emitting chips with a same emitted color in one column of pixel units.

In an embodiment, a plurality of A-electrode pads of one of the pixel units in an i-th column and a row, a plurality of A-electrode pads of one of the pixel units in an (i+1)-th column and the same row, and one of the m common A-electrode pads connected to the plurality of A-electrode pads of the one of the pixel units in the i-th column and the row and the plurality of A-electrode pads of the one of the pixel units in the (i+1)-th column and the same row are U-shaped, where i<n.

In an embodiment, a plurality of B-electrode pads of the one of the pixel units in the i-th column and the row and a plurality of B-electrode pads of the one of the pixel units in the (i+1)-th column and the same row are disposed in a U-shaped opening, where i is an odd number.

In an embodiment, in two adjacent pixel units of the pixel units in a same row, a direction of a connection line from an A electrode to a B electrode of one of the at least two LED light-emitting chips in one of the two adjacent pixel units is opposite to a direction of a connection line from an A electrode to a B electrode of one of the at least two LED light-emitting chips in another one of the two adjacent pixel units.

In an embodiment, conductive vias electrically connected to a plurality of B-electrode pads corresponding to all the at least two LED light-emitting chips of each of the pixel units are not on a same vertical line.

In an embodiment, each of the pixel units comprises following three LED light-emitting chips: a LED light-emitting chip with a first emitted color, a LED light-emitting chip with a second emitted color, and a LED light-emitting chip with a third emitted color, where the three LED light-emitting chips with different emitted colors are in one-to-one correspondence with three B-electrode pads of the plurality of B-electrode pads, and the three B-electrode pads in one-to-one correspondence with the three LED light-emitting chips with different emitted colors are a first B-electrode pad corresponding to the LED light-emitting chip with the first emitted color, a second B-electrode pad corresponding to the LED light-emitting chip with the second emitted color, and a third B-electrode pad corresponding to the LED light-emitting chip with the third emitted color, respectively.

In an embodiment, in the case where N=4, a metal wire connecting all first B-electrode pads of each column of pixel units and a metal wire connecting all third B-electrode pads of each column of pixel units are disposed on a third metal wiring layer among the N metal wiring layers.

In an embodiment, in the case where N=4, a metal wire connecting all second B-electrode pads of each column of pixel units is disposed on a second metal wiring layer among the N metal wiring layers.

In an embodiment, an identification mark for identifying electrodes of pins is disposed on one insulating plate in contact with an N-th metal wiring layer among the N metal wiring layers.

In an embodiment, an identification mark that is used for identifying electrodes of pins and is made of a same material as the m common A-electrode pins and the 3n common B-electrode pins is disposed on one insulating plate in contact with the N-th metal wiring layer and the identification mark is not electrically connected.

In an embodiment, a distance between every two adjacent ones of the identification mark, the m common A-electrode pins, and the 3n common B-electrode pins is the same.

An embodiment of the present application provides a display panel including any LED display unit group described above.

DETAILED DESCRIPTION

As described in the above background, the structure of the traditional LED display unit group is limited by sizes of the pads and metal wires. Therefore, the size of the display unit group is difficult to be further reduced, and it is impossible to improving the integration level of the small-pitch LEDs and improving the circuit stability of the LED display unit group at the same time.

To solve the preceding technical problem, embodiments of the present application provide the technical schemes described below.

An LED display unit group includes a circuit board and pixel units. The circuit board includes N metal wiring layers stacked in sequence and an insulating plate disposed between adjacent metal wiring layers. The N metal wiring layers are electrically connected through conductive vias on the insulating plate, and N≥2. The pixel units are arranged in an array of m rows and n columns and disposed on the circuit board, each pixel unit includes at least two LED light-emitting chips with different emitted colors, and each LED light-emitting chip is fixed on a first metal wiring layer, where m≥2 and n≥2. The first metal wiring layer includes m common A-electrode pads, multiple A-electrode pads, and multiple B-electrode pads. The multiple A-electrode pads are disposed in one-to-one correspondence with A electrodes of LED light-emitting chips, the multiple B-electrode pads are disposed in one-to-one correspondence with B electrodes of the LED light-emitting chips, and all the A-electrode pads corresponding to each row of pixel units are integrally formed with and electrically connected to one common A-electrode pad corresponding to each row of pixel units. Each common A-electrode pad includes at least one bend part, and a bending direction of the bend part of the common A-electrode pad corresponding to a first row of pixel units is opposite to a bending direction of the bend part of the common A-electrode pad corresponding to an m-th row of pixel units.

Figure 1:
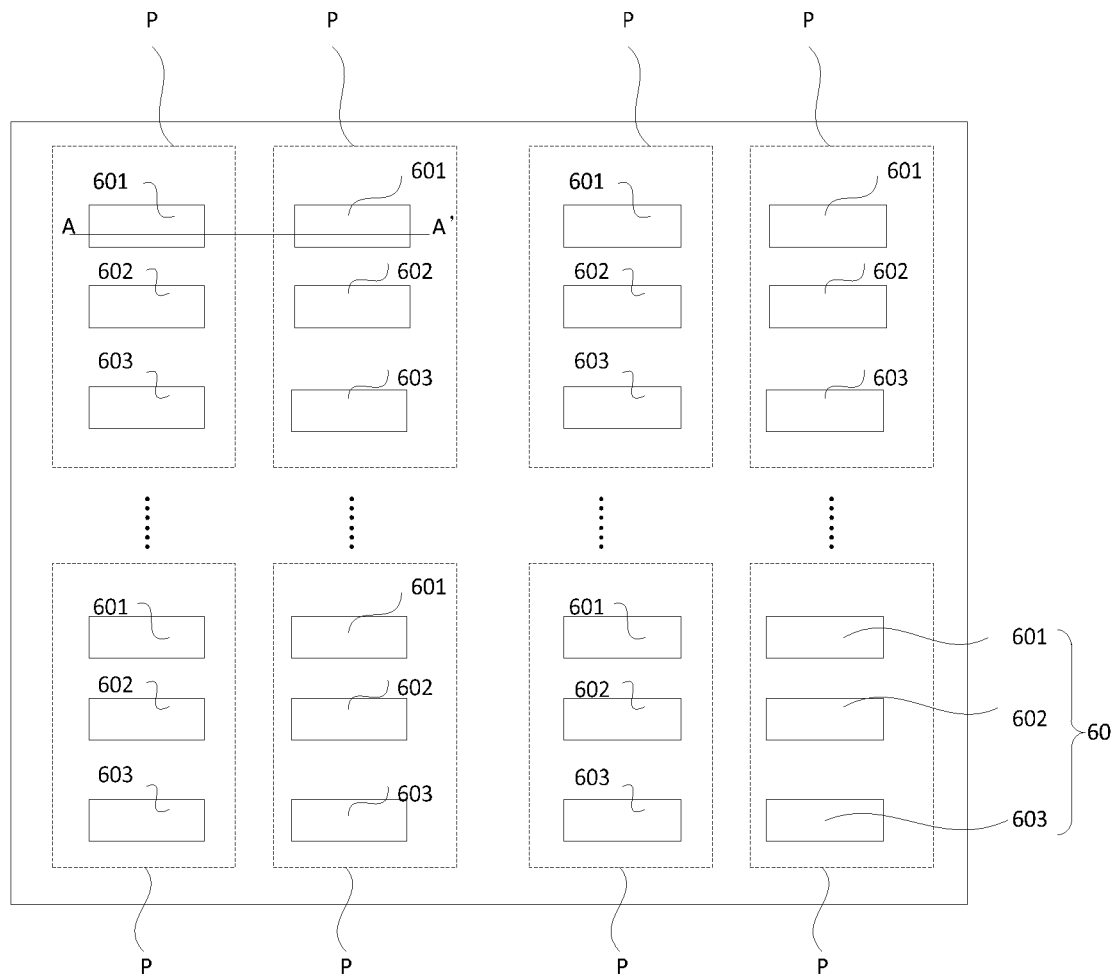
FIG. 1 is a top view of a LED display unit group according to an embodiment of the present application.
Figure 2:
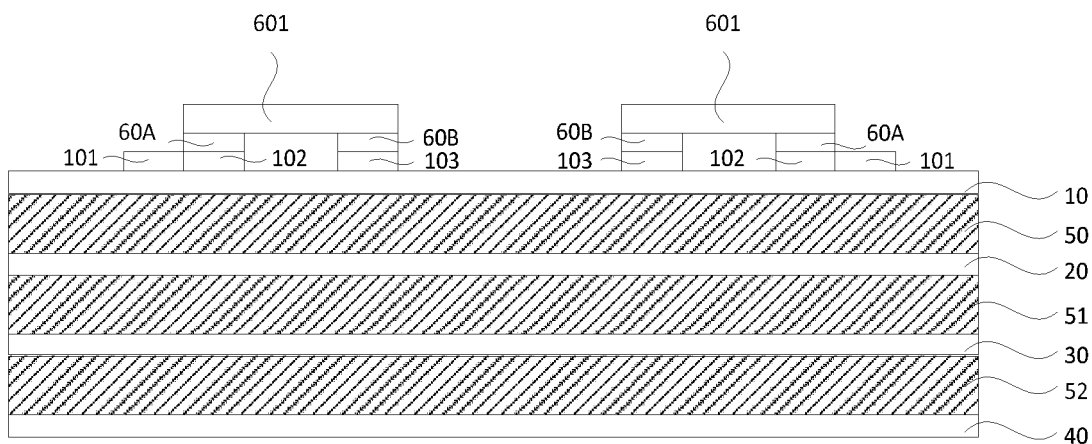
FIG. 2 is a sectional diagram taken along a line A-A' of FIG. 1.
Figure 3:
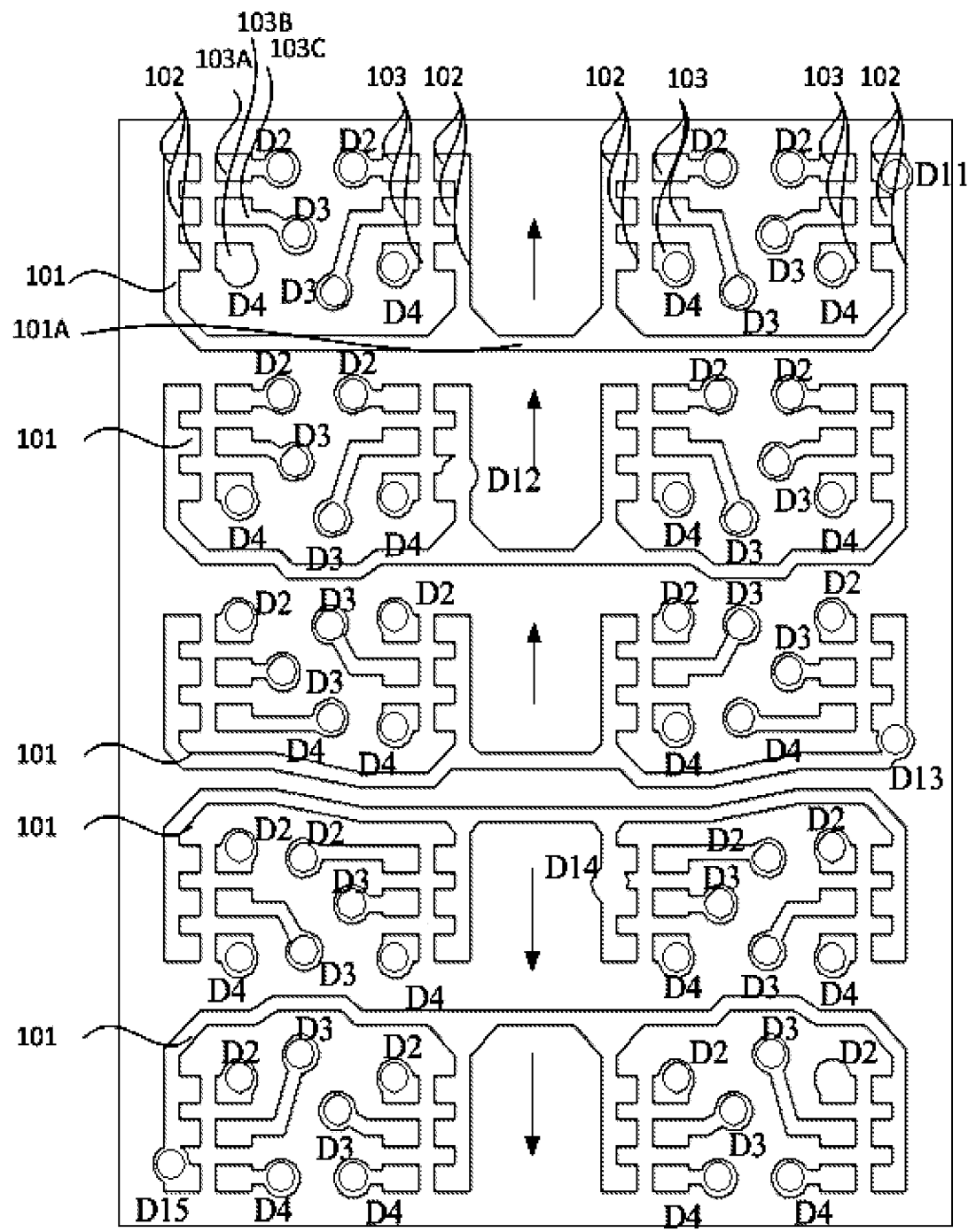
FIG. 3 is a structural diagram of a first metal wiring layer according to an embodiment of the present application.

FIG. 1 is a top view of a LED display unit group according to an embodiment of the present application. FIG. 2 is a sectional diagram taken along a line A-A' of FIG. 1. FIG. 3 is a structural diagram of a first metal wiring layer according to an embodiment of the present application.

For ease of description, in the embodiments of the present application, the technical schemes in the embodiment of the present application are described by using an example in which N=4, m=5, n=4 and each pixel unit includes three LED light-emitting chips with different emitted colors.

Referring to FIGS. 1, 2 and 3, exemplarily, the circuit board includes four metal wiring layers stacked in sequence, and the four metal wiring layers are a first metal wiring layer 10, a second metal wiring layer 20, a third metal wiring layer 30, and a fourth metal wiring layer 40 in sequence from top to bottom. The insulating plate is disposed between every two adjacent metal wiring layers, and there are a first insulating plate 50, a second insulating plate 51, and a third insulating plate 52 in sequence from top to bottom. Two separate PCBs are pressed to form the circuit board. Each PCB includes two metal wiring layers and the insulating plate between the two metal wiring layers, another insulating plate is disposed between the two PCBs, and the three are pressed together to form the circuit board. The four metal wiring layers are electrically connected through the conductive vias (not shown in the figures). Twenty pixel units Ps arranged in an array of five rows and four columns are disposed on the circuit board, and each pixel unit P includes three LED light-emitting chips 60 with different emitted colors, which are a LED light-emitting chip 601 with a first emitted color, a LED light-emitting chip 602 with a second emitted color, and a LED light-emitting chip 603 with a third emitted color, respectively. Each LED light-emitting chip 60 is fixed on the first metal wiring layer 10. Each LED light-emitting chip 60 includes an A electrode 60A and a B electrode 60B. The polarity of the A electrode 60A and the polarity of the B electrode 60B are opposite, and the A electrode 60A and the B electrode 60B are electrically connected to the first metal wiring layer 10. In the embodiments of the present application, the A electrode 60A may be a cathode of the LED light-emitting chip 60, and the B electrode 60B may be an anode of the LED light-emitting chip 60. The first metal wiring layer 10 includes five common A-electrode pads 101, multiple A-electrode pads 102, and multiple B-electrode pads 103. The A-electrode pads 102 are disposed in one-to-one correspondence with the A electrodes of the LED light-emitting chips 60 in the pixel units, the B electrode pads 103 are disposed in one-to-one correspondence with the B electrodes of the LED light-emitting chips 60 in the pixel units, each common A-electrode pad 101 is integrally formed with all the A electrode pads 102 corresponding to one row of pixel units, and all the A-electrode pads 102 corresponding to each row of pixel units Ps are electrically connected to a corresponding common A-electrode pad 101. Each common A-electrode pad 101 includes at least one bend part 101A, and the bending direction of the bend part 101A of the common A-electrode pad 101 corresponding to the first row of pixel units is opposite to the bending direction of the bend part 101A of the common A-electrode pad corresponding to the m-th row of pixel units. Referring to FIG. 3, on the first metal wiring layer 10, the bending direction of the bend part 101A of the common A-electrode pad 101 corresponding to the first three rows of pixel units is opposite to the bending direction of the bend part 101A of the common A-electrode pad 101 corresponding to the fourth row of pixel units and the fifth row of pixel units.

In the LED display unit group provided in the embodiments of the present application, the circuit board includes at least two metal wiring layers stacked in sequence and the insulating plate disposed between adjacent metal wiring layers. At least two metal wiring layers are electrically connected through the conductive vias on the insulating plate. The pixel units Ps arranged in an array of at least 2 rows and 2 columns are disposed on the circuit board. Each pixel unit includes at least two LED light-emitting chips 60 with different emitted colors. Each LED light-emitting chip 60 is fixed on the first metal wiring layer 10. The first metal wiring layer 10 includes at least two common A-electrode pads 101, multiple A-electrode pads 102, and multiple B-electrode pads 103. The A-electrode pads 102 are disposed in one-to-one correspondence with the A electrodes of the LED light-lighting chips 60 in the pixel units. The B-electrode pads 103 are disposed in one-to-one correspondence with the B electrodes 60B of the LED light-emitting chips 60 in the pixel units. Each common A-electrode pad 101 is integrally formed with all the A-electrode pads 102 corresponding to one row of pixel units. All the A-electrode pads 102 corresponding to each row of pixel units are electrically connected to a corresponding common A-electrode pad 101. Each common A-electrode pad 101 includes at least one bend part 101A, and the bending direction of the bend part 101A of the common A-electrode pad 101 corresponding to the first row of pixel units is opposite to the bending direction of the bend part of the common A-electrode pad corresponding to the m-th row of pixel units. An electrical signal required by the A-electrode pad is transmitted to the A-electrode pad 102 through the common A-electrode pad 101, so as to solve the problem in the related art that the size of the display unit group is difficult to be reduced due to the limitation of the sizes of the pads and metal wires, thereby improving the integration level of the LED light-emitting chips while the circuit stability is ensured.

Figure 4:
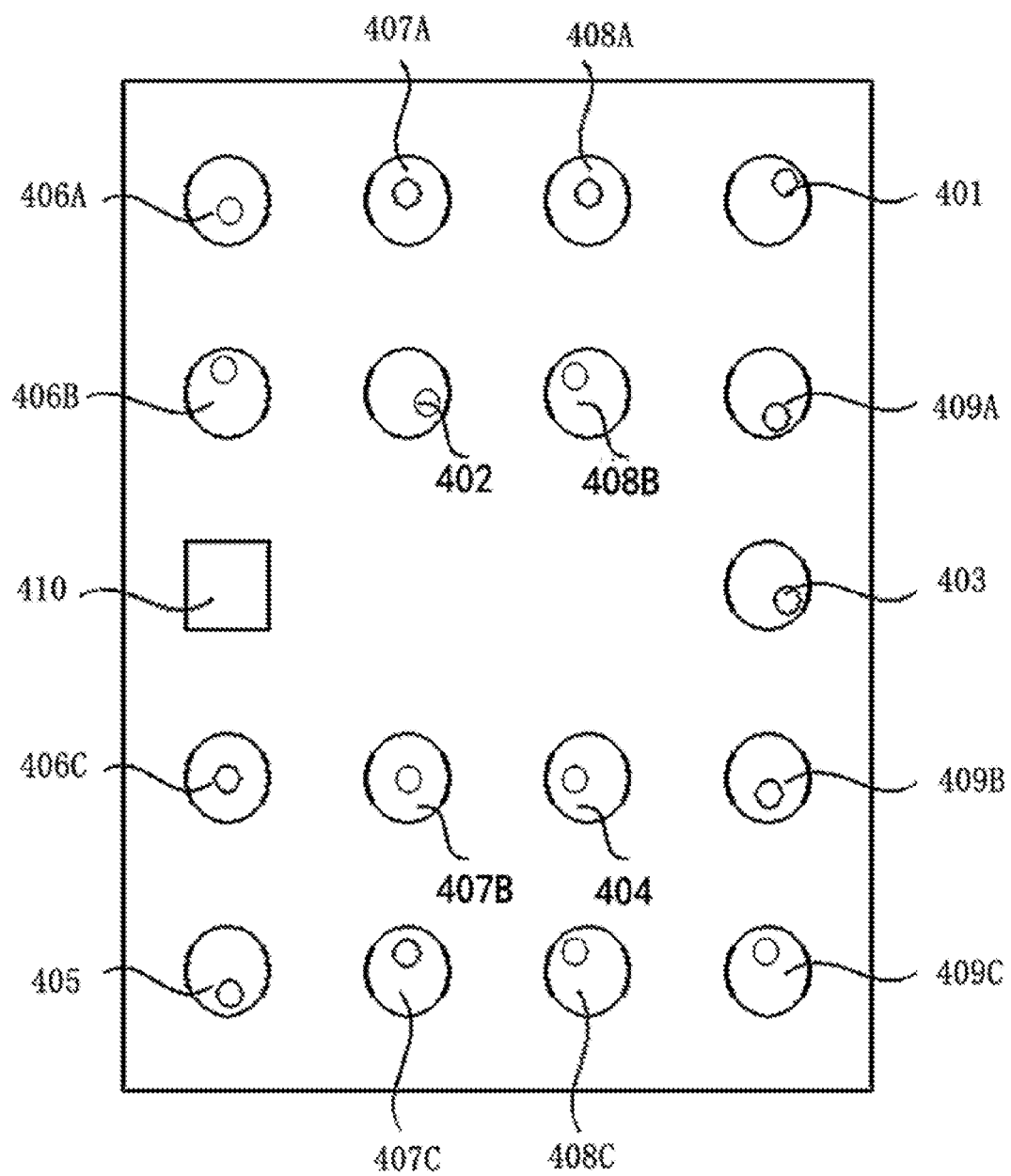
FIG. 4 is a structural diagram of a fourth metal wiring layer according to an embodiment of the present application.

In an embodiment, an N-th metal wiring layer includes m common A-electrode pins and 3n common B-electrode pins. One common A-electrode pin is electrically connected to the common A-electrode pad corresponding to the A electrodes of the LED light-emitting chips in one row of pixel units, and one common B-electrode pin is electrically connected to the B-electrode pads corresponding to the B electrodes of the LED light-emitting chips with a same emitted color in one column of pixel units. FIG. 4 is a structural diagram of a fourth metal wiring layer according to an embodiment of the present application. Referring to FIG. 4, in this embodiment, the N-th metal wiring layer is the fourth metal wiring layer 40. Referring to FIG. 4, the fourth metal wiring layer 40 includes five common A-electrode pins, which are a common A-electrode pin 401 in the first row, a common A-electrode pin 402 in the second row, a common A-electrode pin 403 in the third row, a common A-electrode pin 404 in the fourth row, and a common A-electrode pin 405 in the fifth row. Twelve common B-electrode pins are a first common B-electrode pin 406A in the first column, a second common B-electrode pin 406B in the first column, a third common B-electrode pin 406C in the first column, a first common B-electrode pin 407A in the second column, a second common B-electrode pin 407B in the second column, a third common B-electrode pin 407C in the second column, a first common B-electrode pin 408A in the third column, a second common B-electrode pin 408B in the third column, a third common B-electrode pin 408C in the third column, a first common B-electrode pin 409A in the fourth column, a second common B-electrode pin 409B in the fourth column, and a third common B-electrode pin 409C in the fourth column, respectively. One common A-electrode pin is electrically connected to one common A-electrode pad corresponding to the A electrodes of the LED light-emitting chips in one row of pixel units through the conductive via, and one common B-electrode pin is electrically connected to the B-electrode pads corresponding to the B electrodes of the LED light-emitting chips with the same emitted color in one column of pixel units.

In the embodiment of the present application, the common A-electrode pins and the common B-electrode pins disposed on the fourth metal wiring layer 40 transmit driving electrical signals to the A electrodes and the B electrodes of the LED light-emitting chips on the first metal wiring layer 10 through the conductive vias, so as to solve the problem in the related art that the size of the display unit group is difficult to be reduced due to the limitation of the sizes of the pads and metal wires, thereby improving the integration level of the LED light-emitting chips while the circuit stability is ensured.

In an embodiment, multiple A-electrode pads of the pixel unit in an i-th column and a row, multiple A-electrode pads of the pixel unit in an (i+1)-th column and the same row, and one common A-electrode pad connected to the multiple A-electrode pads of the pixel unit in the i-th column and the row and the multiple A-electrode pads of the pixel unit in the (i+1)-th column and the same row are U-shaped, where i<n. Exemplarily, referring to FIG. 3, multiple A-electrode pads 102 of the pixel unit in the first column and a row, multiple A-electrode pads 102 of the pixel unit in the second column and the same row, and the common A-electrode pad 101 connected to the multiple A-electrode pads 102 of the two pixel units are U-shaped, and multiple A-electrode pads 102 of the pixel unit in the third column and a row, multiple A-electrode pads 102 of the pixel unit in the fourth column and the same row, and the common A-electrode pad 101 connected to the multiple A-electrode pads 102 of the two pixel units are U-shaped.

In an embodiment, multiple B-electrode pads of the pixel unit in the i-th column and a row and multiple B-electrode pads of the pixel unit in the (i+1)-th column and the same row are disposed in a U-shaped opening, where i is an odd number. Exemplarily, referring to FIG. 3, multiple B-electrode pads of the pixel unit in the first column and a row and multiple B-electrode pads of the pixel unit in the second column and the same row are disposed in the U-shaped opening. Multiple B-electrode pads of the pixel unit in the third column and a row and multiple B-electrode pads of the pixel unit in the fourth column and the same row are disposed in the U-shaped opening.

In an embodiment, in two adjacent pixel units in a same row, a direction of a connection line from the A electrode to the B electrode of the LED light-emitting chip in one of the two adjacent pixel units is opposite to a direction of a connection line from the A electrode to the B electrode of the LED light-emitting chip in another one of the two adjacent pixel units. Referring to FIGS. 1 and 2, in each row of pixel units, a direction of a connection line from the A electrode 60A to the B electrode 60B of one of two LED light-emitting chips 601 with the first emitted color in adjacent pixel units Ps is opposite to a direction of a connection line from the A electrode 60A to the B electrode 60B of the other one of two LED light-emitting chips 601 with the first emitted color in the adjacent pixel units Ps. In each row of pixel units, a direction of a connection line from the A electrode 60A to the B electrode 60B of one of two LED light-emitting chips 602 with the second emitted color in adjacent pixel units Ps is opposite to a direction of a connection line from the A electrode 60A to the B electrode 60B of the other one of two LED light-emitting chips 602 with the second emitted color in the adjacent pixel units Ps. In each row of pixel units, a direction of a connection line from the A electrode 60A to the B electrode 60B of one of two LED light-emitting chips 603 with the third emitted color in adjacent pixel units Ps is opposite to a direction of a connection line from the A electrode 60A to the B electrode 60B of the other one of two LED light-emitting chips 603 with the third emitted color in the adjacent pixel units Ps.

In an embodiment, the conductive vias electrically connected to multiple B-electrode pads corresponding to all the LED light-emitting chips of each pixel unit are not on a same vertical line. Referring to FIG. 3, the conductive vias electrically connected to multiple B-electrode pads 103 corresponding to all the LED light-emitting chips of each pixel unit are conductive vias D2, D3, and D4, respectively. Referring to FIG. 3, a connection line between the conductive via D2 and the conductive via D3 and a connection line between the conductive via D3 and the conductive via D4 forms a certain angle with a vertical direction, that is, the conductive vias are disposed in a misaligned manner and not in the same vertical line.

In an embodiment, each pixel unit includes a LED light-emitting chip with the first emitted color, a LED light-emitting chip with the second emitted color, and a LED light-emitting chip with the third emitted color, the three LED light-emitting chips with different emitted colors are in one-to-one correspondence with three B-electrode pads, and the three B-electrode pads in one-to-one correspondence with the three LED light-emitting chips with different emitted colors are a first B-electrode pad corresponding to the LED light-emitting chip with the first emitted color, a second B-electrode pad corresponding to the LED light-emitting chip with the second emitted color, and a third B-electrode pad corresponding to the LED light-emitting chip with the third emitted color, respectively. Referring to FIGS. 1 and 3, each pixel unit P includes the LED light-emitting chip 601 with the first emitted color, the LED light-emitting chip 602 with the second emitted color, and the LED light-emitting chip 603 with the third emitted color, the three LED light-emitting chips with different emitted colors are in one-to-one correspondence with three B-electrode pads 103, and the three B-electrode pads 103 in one-to-one correspondence with the three LED light-emitting chips with different emitted colors are a first B-electrode pad 103A corresponding to the LED light-emitting chip 601 with the first emitted color, a second B-electrode pad 103B corresponding to the LED light-emitting chip 602 with the second emitted color, and a third B-electrode pad 103C corresponding to the LED light-emitting chip 603 with the third emitted color, respectively.

Figure 6:
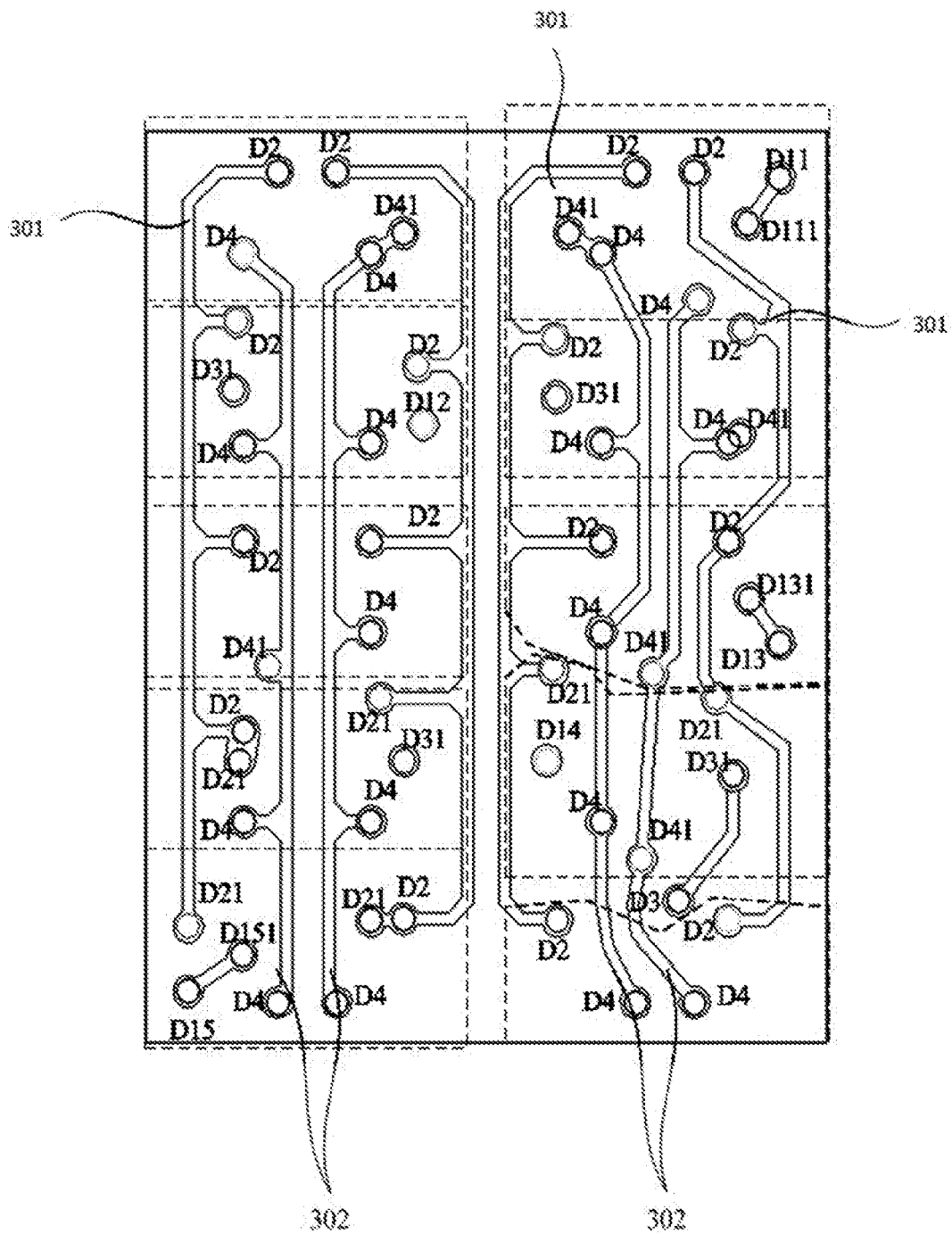
FIG. 6 is a structural diagram of a third metal wiring layer according to an embodiment of the present application.

In an embodiment, in the case where N=4, a metal wire connecting first B-electrode pads corresponding to each column of pixel units and a metal wire connecting third B-electrode pads corresponding to each column of pixel units are disposed on a third metal wiring layer. FIG. 6 is a structural diagram of a third metal wiring layer according to an embodiment of the present application. Referring to FIGS. 4 and 6, in the case where N=4, a metal wire connecting first B-electrode pads 103A corresponding to each column of pixel units and a metal wire connecting third B-electrode pads 103C corresponding to each column of pixel units are disposed on the third metal wiring layer 30. The first B-electrode pad 103A on the first metal wiring layer 10 is electrically connected to the conductive via D2 penetrating from the first metal wiring layer 10 to the third metal wiring layer 30, a first metal wire 301 is electrically connected to the conductive via D2 and electrically connected to a conductive via D21 penetrating the third metal wiring layer 30 and the fourth metal wiring layer 40, and the corresponding conductive via D21 in the first column of pixel units is electrically connected to the first common B-electrode pin 406A in the first column. The corresponding conductive via D21 in the second column of pixel units is electrically connected to the first common B-electrode pin 407A in the second column on the fourth metal wiring layer 40. The corresponding conductive via D21 in the third column of pixel units is electrically connected to the first common B-electrode pin 408A in the third column on the fourth metal wiring layer 40. The corresponding conductive via D21 in the fourth column of pixel units is electrically connected to the first common B-electrode pin 409A in the fourth column on the fourth metal wiring layer 40.

The third B-electrode pad 103C on the first metal wiring layer 10 is electrically connected to the conductive via D4, a third metal wire 302 is electrically connected to the conductive via D4 penetrating from the first metal wiring layer 10 to the third metal wiring layer 30 and electrically connected to a conductive via D41 penetrating the third metal wiring layer 30 and the fourth metal wiring layer 40, and the corresponding conductive via D41 in the first column of pixel units is electrically connected to the third common B-electrode pin 406C in the first column on the fourth metal wiring layer 40. The corresponding conductive via D41 in the second column of pixel units is electrically connected to the third common B-electrode pin 407C in the second column on the fourth metal wiring layer 40. The corresponding conductive via D41 in the third column of pixel units is electrically connected to the third common B-electrode pin 408C in the third column on the fourth metal wiring layer 40. The corresponding conductive via D41 in the fourth column of pixel units is electrically connected to the third common B-electrode pin 409C in the fourth column on the fourth metal wiring layer 40.

In an embodiment, in the case where N=4, a metal wire connecting the second B-electrode pad corresponding to each column of pixel units is disposed on the second metal wiring layer.

Figure 5:
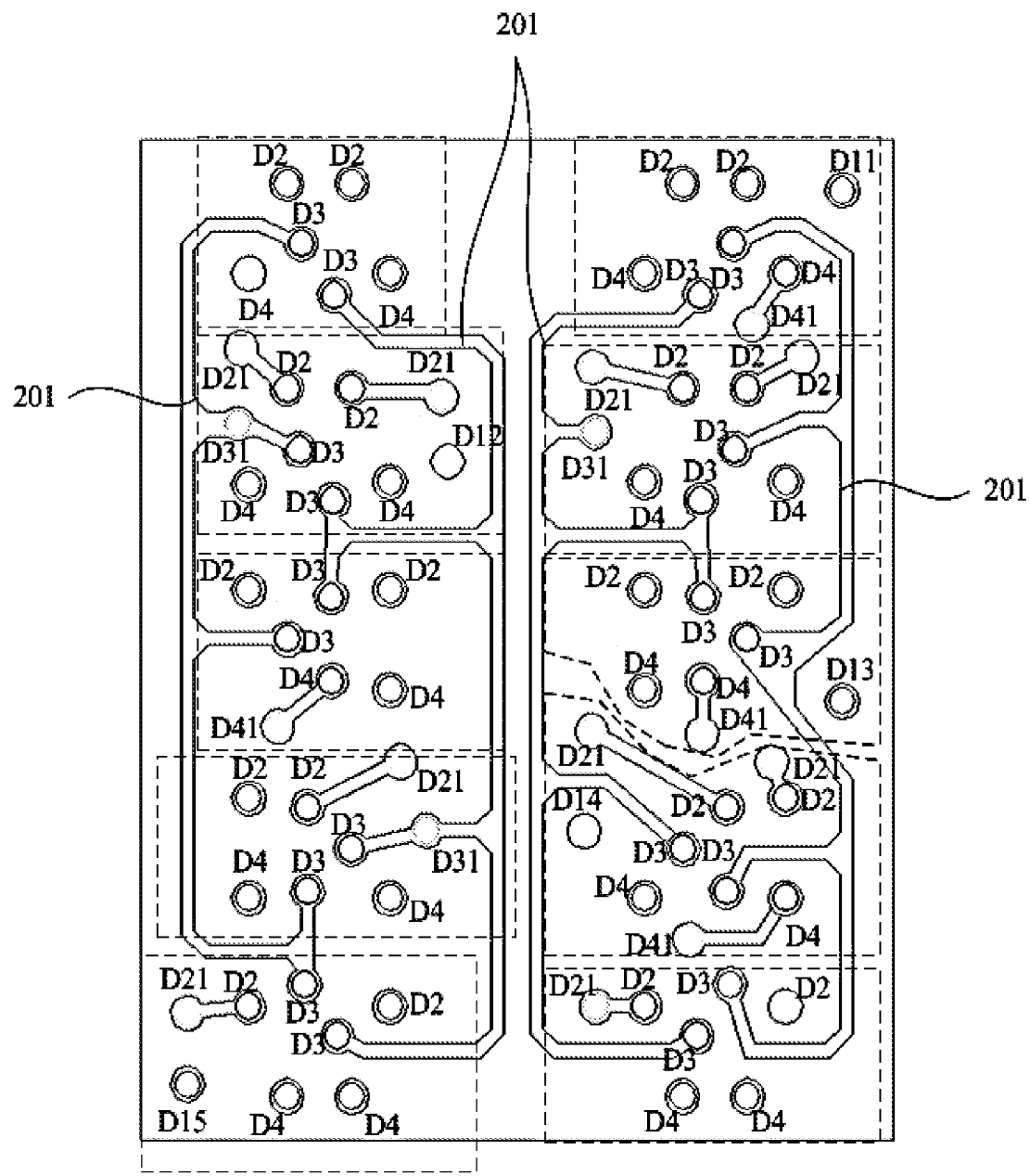
FIG. 5 is a structural diagram of a second metal wiring layer according to an embodiment of the present application.

FIG. 5 is a structural diagram of a second metal wiring layer according to an embodiment of the present application. Referring to FIGS. 4 and 5, the second B-electrode pad 103B on the first metal wiring layer 10 is electrically connected to the conductive via D3 penetrating the first metal wiring layer 10 and the second metal wiring layer 20, a second metal wire 201 is electrically connected to the conductive via D3 and electrically connected to a conductive via D31 penetrating the second metal wiring layer 20 and the fourth metal wiring layer 40, and the corresponding conductive via D31 in the first column of pixel units is electrically connected to the second common B-electrode pin 406B in the first column on the fourth metal wiring layer 40. The corresponding conductive via D31 in the second column of pixel units is electrically connected to the second common B-electrode pin 407B in the second column on the fourth metal wiring layer 40. The corresponding conductive via D31 in the third column of pixel units is electrically connected to the second common B-electrode pin 408B in the third column on the fourth metal wiring layer 40. The corresponding conductive via D31 in the fourth column of pixel units is electrically connected to the second common B-electrode pin 409B in the fourth column on the fourth metal wiring layer 40.

In an embodiment, an identification mark for identifying electrodes of pins is disposed on the insulating plate in contact with an N-th metal wiring layer.

Referring to FIG. 4, an identification mark for identifying electrodes of pins is disposed on the insulating plate in contact with the fourth metal wiring layer. In an embodiment, an insulating layer is disposed on a side of the fourth metal wiring layer facing away from the insulating plate. The material of the insulating layer includes white oil, resin, green oil or the like for the purpose of insulation and protection. The insulating layer consists of two different colors of insulating material, such as white oil and green oil, and a dividing line of the two different colors of insulating material divides the insulating layer into two parts of different colors, forming an identification mark for identifying the electrodes of the pins.

In an embodiment, the insulating layer (such as white oil) may be coated on a side of the fourth metal wiring layer facing away from the insulating plate, and then an insulating material (such as green oil) with quite a different color from the color of the insulating layer is coated on the surface of the insulating layer, where the shape of the coating may be a triangle or another shape for identifying the electrodes of the pins.

In an embodiment, an identification mark 410 that is used for identifying the electrodes of the pins and is made of the same material as the common A-electrode pins and the common B-electrode pins may be disposed on the insulating plate in contact with the N-th metal wiring layer and the identification mark 410 is not electrically connected. A shape of the identification mark is different from a shape of the common A-electrode pin and a shape of the common B-electrode pin. A distance between every two adjacent ones of the identification mark, the m common A-electrode pins, and the 3n common B-electrode pins is the same.

In an embodiment, in the preceding embodiments, the conductive via is filled with insulating material, and the insulating material does not extend beyond upper and lower surfaces of the circuit board. The insulating material includes resin or green oil and does not exceed out from the upper and lower surfaces of the circuit board. Filling is performed in this manner so that a contact area between the encapsulation material and the circuit board is increased during the subsequent device encapsulation, thereby strengthening the adhesion between the encapsulation material and the circuit board and improving the sealing performance.

In an embodiment, the conductive vias in the embodiments of the present application may also be replaced with metal columns (for example, copper columns). In an embodiment, a diameter of the metal column is less than 0.2 mm. Holes are drilled on the PCB, and then electroplating copper deposition is performed. Due to the small aperture, metal copper fills the holes and directly forms the copper columns. The smaller the aperture is, the better the sealing performance of the device is.

In the preceding embodiments, ink layers are disposed between pixel regions of adjacent rows and adjacent columns, and the ink may be black ink or other relatively dark ink and formed by the inkjet printing technology, thereby improving the contrast of the device surface and improving the fidelity of the display color.

Based on the same concept, an embodiment of the present application further provides a display panel. The display panel includes any LED display unit group described in the preceding schemes.

What is claimed is:

1. A light-emitting diode (LED) display unit group, comprising:
    a circuit board comprising N metal wiring layers stacked in sequence and at least one insulating plate, wherein each of the at least one insulating plate is disposed between adjacent metal wiring layers among the N metal wiring layers, the N metal wiring layers are electrically connected through conductive vias on the at least one insulating plate, and N≥2; and
    pixel units arranged in an array of m rows and n columns and disposed on the circuit board, wherein each of the pixel units comprises at least two LED light-emitting chips with different emitted colors, each of the at least two LED light-emitting chips is fixed on a first metal wiring layer among the N metal wiring layers, m≥2, and n≥2;
    wherein the first metal wiring layer comprises m common A-electrode pads, a plurality of A-electrode pads, and a plurality of B-electrode pads, wherein the plurality of A-electrode pads are disposed in one-to-one correspondence with A electrodes of LED light-emitting chips, the plurality of B-electrode pads are disposed in one-to-one correspondence with B electrodes of the LED light-emitting chips, and all A-electrode pads corresponding to each row of pixel units in the pixel units are integrally formed with and electrically connected to one of the m common A-electrode pads corresponding to the each row of pixel units; and
    each of the m common A-electrode pads comprises at least one bend part, and a bending direction of the at least one bend part of one of the m common A-electrode pads corresponding to a first row of pixel units in the pixel units is opposite to a bending direction of the at least one bend part of one of the m common A-electrode pads corresponding to an m-th row of pixel units in the pixel units;
    wherein in two adjacent pixel units of the pixel units in a same row, a direction of a connection line from an A electrode to a B electrode of one of the at least two LED light-emitting chips in one of the two adjacent pixel units is opposite to a direction of a connection line from an A electrode to a B electrode of one of the at least two LED light-emitting chips in another one of the two adjacent pixel units.

2. The LED display unit group of claim 1, wherein an N-th metal wiring layer among the N metal wiring layers comprises m common A-electrode pins and 3n common B-electrode pins, wherein one of the m common A-electrode pins is electrically connected to one of the m common A-electrode pads corresponding to A electrodes of all LED light-emitting chips in one row of pixel units in the pixel units, and one of the 3n common B-electrode pins is electrically connected to a plurality of B-electrode pads corresponding to B electrodes of all LED light-emitting chips with a same emitted color in one column of pixel units in the pixel units.

3. The LED display unit group of claim 1, wherein a plurality of A-electrode pads of one of the pixel units in an i-th column and a row, a plurality of A-electrode pads of one of the pixel units in an (i+1)-th column and the same row, and one of the m common A-electrode pads connected to the plurality of A-electrode pads of the one of the pixel units in the i-th column and the row and the plurality of A-electrode pads of the one of the pixel units in the (i+1)-th column and the same row are U-shaped, wherein i<n.

4. The LED display unit group of claim 3, wherein a plurality of B-electrode pads of the one of the pixel units in the i-th column and the row and a plurality of B-electrode pads of the one of the pixel units in the (i+1)-th column and the same row are disposed in a U-shaped opening, wherein i is an odd number.

5. The LED display unit group of claim 1, wherein conductive vias electrically connected to a plurality of B-electrode pads corresponding to all the at least two LED light-emitting chips of each of the pixel units are not on a same vertical line.

6. The LED display unit group of claim 1, wherein each of the pixel units comprises following three LED light-emitting chips: a LED light-emitting chip with a first emitted color, a LED light-emitting chip with a second emitted color, and a LED light-emitting chip with a third emitted color, wherein the three LED light-emitting chips with different emitted colors are in one-to-one correspondence with three B-electrode pads of the plurality of B-electrode pads, and the three B-electrode pads in one-to-one correspondence with the three LED light-emitting chips with different emitted colors are a first B-electrode pad corresponding to the LED light-emitting chip with the first emitted color, a second B-electrode pad corresponding to the LED light-emitting chip with the second emitted color, and a third B-electrode pad corresponding to the LED light-emitting chip with the third emitted color, respectively.

7. The LED display unit group of claim 6, wherein in a case where N=4, a metal wire connecting all first B-electrode pads of each column of pixel units in the pixel units and a metal wire connecting all third B-electrode pads of each column of pixel units in the pixel units are disposed on a third metal wiring layer among the N metal wiring layers.

8. The LED display unit group of claim 6, wherein in a case where N=4, a metal wire connecting all second B-electrode pads of each column of pixel units in the pixel units is disposed on a second metal wiring layer among the N metal wiring layers.

9. The LED display unit group of claim 1, wherein an identification mark for identifying electrodes of pins is disposed on one of the at least one insulating plate in contact with an N-th metal wiring layer among the N metal wiring layers.

10. The LED display unit group of claim 2, wherein an identification mark that is used for identifying electrodes of pins and is made of a same material as the m common A-electrode pins and the 3n common B-electrode pins is disposed on one of the at least one insulating plate in contact with an N-th metal wiring layer among the N metal wiring layers, and the identification mark is not electrically connected.

11. The LED display unit group of claim 10, wherein a distance between every two adjacent ones of the identification mark, the m common A-electrode pins, and the 3n common B-electrode pins is the same.

12. A display panel, comprising a light-emitting diode (LED) display unit group, wherein the LED display unit group comprises:
a circuit board comprising N metal wiring layers stacked in sequence and at least one insulating plate, wherein each of the at least one insulating plate is disposed between adjacent metal wiring layers among the N metal wiring layers, the N metal wiring layers are electrically connected through conductive vias on the at least one insulating plate, and N≥2; and
pixel units arranged in an array of m rows and n columns and disposed on the circuit board, wherein each of the pixel units comprises at least two LED light-emitting chips with different emitted colors, each of the at least two LED light-emitting chips is fixed on a first metal wiring layer among the N metal wiring layers, m≥2, and n≥2;
wherein the first metal wiring layer comprises m common A-electrode pads, a plurality of A-electrode pads, and a plurality of B-electrode pads, wherein the plurality of A-electrode pads are disposed in one-to-one correspondence with A electrodes of LED light-emitting chips, the plurality of B-electrode pads are disposed in one-to-one correspondence with B electrodes of the LED light-emitting chips, and all A-electrode pads corresponding to each row of pixel units in the pixel units are integrally formed with and electrically connected to one of the m common A-electrode pads corresponding to the each row of pixel units; and
each of the m common A-electrode pads comprises at least one bend part, and a bending direction of the at least one bend part of one of the m common A-electrode pads corresponding to a first row of pixel units in the pixel units is opposite to a bending direction of the at least one bend part of one of the m common A-electrode pads corresponding to an m-th row of pixel units in the pixel units;
wherein in two adjacent pixel of the units in a same row, a direction of a connection line from an A electrode to a B electrodeof one the at least two LED light-emitting chips in one of the two adjacent pixel units is opposite to a direction of a connection line from an A electrode to a B electrode of one of the at least two LED light-emitting chips in another one of the two adjacent pixel units.

13. The display panel of claim 12, wherein an N-th metal wiring layer among the N metal wiring layers comprises m common A-electrode pins and 3n common B-electrode pins, wherein one of the m common A-electrode pins is electrically connected to one of the m common A-electrode pads corresponding to A electrodes of all LED light-emitting chips in one row of pixel units in the pixel units, and one of the 3n common B-electrode pins is electrically connected to a plurality of B-electrode pads corresponding to B electrodes of all LED light-emitting chips with a same emitted color in one column of pixel units in the pixel units.

14. The display panel of claim 12, wherein a plurality of A-electrode pads of one of the pixel units in an i-th column and a row, a plurality of A-electrode pads of one of the pixel units in an (i+1)-th column and the same row, and one of the m common A-electrode pads connected to the plurality of A-electrode pads of the one of the pixel units in the i-th column and the row and the plurality of A-electrode pads of the one of the pixel units in the (i+1)-th column and the same row are U-shaped, wherein i<n.

15. The display panel of claim 14, wherein a plurality of B-electrode pads of the one of the pixel units in the i-th column and the row and a plurality of B-electrode pads of the one of the pixel units in the (i+1)-th column and the same row are disposed in a U-shaped opening, wherein i is an odd number.

16. The display panel of claim 12, wherein conductive vias electrically connected to a plurality of B-electrode pads corresponding to all the at least two LED light-emitting chips of each of the pixel units are not on a same vertical line.

17. The display panel of claim 12, wherein each of the pixel units comprises following three LED light-emitting chips: a LED light-emitting chip with a first emitted color, a LED light-emitting chip with a second emitted color, and a LED light-emitting chip with a third emitted color, wherein the three LED light-emitting chips with different emitted colors are in one-to-one correspondence with three B-electrode pads of the plurality of B-electrode pads, and the three B-electrode pads in one-to-one correspondence with the three LED light-emitting chips with different emitted colors are a first B-electrode pad corresponding to the LED light-emitting chip with the first emitted color, a second B-electrode pad corresponding to the LED light-emitting chip with the second emitted color, and a third B-electrode pad corresponding to the LED light-emitting chip with the third emitted color, respectively.

18. The display panel of claim 17, wherein in a case where N=4, a metal wire connecting all first B-electrode pads of each column of pixel units in the pixel units and a metal wire connecting all third B-electrode pads of each column of pixel units in the pixel units are disposed on a third metal wiring layer among the N metal wiring layers.

\* \* \* \* \*